(12) United States Patent
He et al.

(10) Patent No.: US 10,822,721 B2
(45) Date of Patent: Nov. 3, 2020

(54) METHOD TO IMPROVE MOCVD REACTION PROCESS BY FORMING PROTECTIVE FILM

(71) Applicant: Advanced Micro-Fabrication Equipment Inc, Shanghai, Shanghai (CN)

(72) Inventors: Xiaoming He, Shanghai (CN); Shiping Guo, Shanghai (CN)

(73) Assignee: ADVANCED MICRO-FABRICATION EQUIPMENT INC. CHINA, Shanghai (CN)

( * ) Notice: Subject to any disclaimer, the term of this patent is extended or adjusted under 35 U.S.C. 154(b) by 51 days.

(21) Appl. No.: 16/134,801

(22) Filed: Sep. 18, 2018

(65) Prior Publication Data

US 2019/0032246 A1    Jan. 31, 2019

Related U.S. Application Data

(62) Division of application No. 15/043,041, filed on Feb. 12, 2016, now abandoned.

(30) Foreign Application Priority Data

Feb. 16, 2015 (CN) .......................... 2015 1 0084011

(51) Int. Cl.
   *C23C 16/44*    (2006.01)
   *C30B 29/40*    (2006.01)
   (Continued)

(52) U.S. Cl.
   CPC ........ *C30B 29/406* (2013.01); *C23C 16/4404* (2013.01); *C30B 25/08* (2013.01); *H01L 33/0062* (2013.01)

(58) Field of Classification Search
   CPC .... C23C 16/4404; C30B 29/406; C30B 29/16
   See application file for complete search history.

(56) References Cited

U.S. PATENT DOCUMENTS 5,624,498 A * 4/1997 Lee ................... C23C 16/45574
                                                        118/715
6,302,964 B1 * 10/2001 Umotoy ............ C23C 16/45514
                                                        118/715

(Continued)

FOREIGN PATENT DOCUMENTS

EP        0674336 A1 *  9/1995  .............. H01J 37/32

OTHER PUBLICATIONS

Boudaden, Jamila, et al., "An Approach to Reduce Greenhouse Gases in the Semiconductor Industry Using F2 Dissociated in Plasma for CVD Chamber Cleaning". Appl. Sci. 2018, 8, 846; doi:10.3390/app8060846, pp. 1-8.*

*Primary Examiner* — Bret P Chen
(74) *Attorney, Agent, or Firm* — Womble Bond Dickinson (US) LLP; Joseph Bach, Esq.

(57) ABSTRACT

A method to improve the MOCVD reaction by protection film on the stainless steel body in the MOCVD reaction chamber. The film is composed of the elements of the gas required during the MOCVD deposition process, or the elements that will not react with the reaction gases of MOCVD. The film is a compound of at least one of Al, Ga and Mg and at least one of oxygen or nitrogen, or other materials with stable chemical characteristics that will not react with the gases in the MOCVD process. The film could reduce the initialization time of the MOCVD process, and improve the efficiency of the MOCVD equipment. The protection film has compact organization with porosity of less than 1%, and thickness of 1 nm to 0.5 mm.

18 Claims, 4 Drawing Sheets

(51) Int. Cl.
 *C30B 25/08*     (2006.01)
 *H01L 33/00*     (2010.01)

(56) References Cited

U.S. PATENT DOCUMENTS

| | | | |
|---|---|---|---|
| 9,099,398 B2* | 8/2015 | Kang | H01J 37/3244 |
| 9,267,205 B1* | 2/2016 | Ishikawa | C23C 16/45572 |
| 9,728,380 B2* | 8/2017 | Mohn | C23C 16/45589 |
| 2002/0015855 A1* | 2/2002 | Sajoto | C23C 14/568 |
| | | | 428/639 |
| 2008/0196666 A1* | 8/2008 | Toshima | C23C 16/45565 |
| | | | 118/723 E |
| 2009/0107403 A1* | 4/2009 | Moshtagh | C23C 16/45504 |
| | | | 118/728 |
| 2009/0241833 A1* | 10/2009 | Moshtagh | C23C 16/45504 |
| | | | 118/715 |
| 2011/0052833 A1* | 3/2011 | Hanawa | C23C 16/4404 |
| | | | 427/534 |
| 2011/0308463 A1* | 12/2011 | He | C23C 16/45519 |
| | | | 118/724 |
| 2011/0315081 A1* | 12/2011 | Law | C23C 16/45565 |
| | | | 118/723 MW |
| 2012/0052216 A1* | 3/2012 | Hanawa | C23C 16/45565 |
| | | | 427/582 |
| 2012/0305190 A1* | 12/2012 | Kang | H01J 37/321 |
| | | | 156/345.34 |
| 2016/0319428 A1* | 11/2016 | Rasheed | C23C 16/45544 |
| 2017/0130331 A1* | 5/2017 | Liu | C23C 16/45565 |
| 2017/0204516 A1* | 7/2017 | Nguyen | C23C 16/4404 |

\* cited by examiner

METHOD TO IMPROVE MOCVD REACTION PROCESS BY FORMING PROTECTIVE FILM

CROSS-REFERENCE TO RELATED APPLICATIONS

This is a divisional application of U.S. patent application Ser. No. 15/043,041, filed on Feb. 12, 2016, which claims priority from Chinese Patent Application No. 201510084011.7, filed on Feb. 16, 2015, the disclosures of which are incorporated herein in their entireties.

TECHNICAL FIELD

The invention involves the technical field of improving MOCVD reaction process, especially referring to the technical field of improving the reaction process by improving the features of the reaction components inside the MOCVD equipment.

BACKGROUND ART

With the constant development of semiconductor technology, Metal-organic Chemical Vapor Deposition (MOCVD) has been widely used in more and more applications. MOCVD is the core equipment used to prepare epitaxial materials of gallium nitride LED and power devices. The epitaxial generation process is conducted in the MOCVD reaction chamber. Since the temperature of the susceptor will increase to more than 1000° C. during the MOCVD generation process, the whole reaction chamber and the gas showerhead components shall be made of stainless steel to tolerate such high temperature. $CP_2Mg$ gas is required in the MOCVD generation process, which could easily react with the free iron ions on the stainless steel surface to make the iron ions reach the substrates with the reaction gas and form deep levels in the gallium nitride LED structure. In this way, iron ions will significantly influence the luminescence performance of the LED made through the MOCVD process. In addition, if the reaction between $CP_2Mg$ with the stainless steel surface could not reach the saturation condition, the $CP_2Mg$ gas introduced into the MOCVD reaction chamber will be greatly consumed on the stainless steel components, the designed p-type doping concentration could not reached, and the performance of the LED will be influenced.

In the prior technology, the method used to solve the above problems is to introduce $CP_2Mg$ gas into the MOCVD reaction chamber and expose the reaction chamber to the air until the reaction between the $CP_2Mg$ and the stainless steel surface reaches saturation condition. However, this process required a long time, such as several weeks or even more than one month. During this process, a great amount of time and $CP_2Mg$ gas will be consumed. In addition, due to the instability of the process, the acceptance rate of the LED epitaxial wafers through MOCVD process is low, influencing the productivity of the MOCVD equipment.

Invention Contents

To solve the above technical problems, the invention has provided a process component to improve MOCVD reaction process, which includes a stainless steel body. The surface of the stainless steel body is covered by a protection film which is a compound composed of at least one of the Al, Ga and Mg and at least one of the nitrogen and oxygen, or a Teflon material that will not react with the gases in the MOCVD processes. The porosity of said protection film is less than 1%.

Optimized, the thickness of said protection film is 1 nm to 0.5 mm.

Optimized, the thickness of the protection film is 1 nm to 10 μm, and the roughness of the surface of the stainless steel body is 1 μm to 2 μm.

Optimized, the thickness of the protection film is 10 μm to 0.5 mm, and the roughness of the surface of the stainless steel body is 2 μm to 10 μm.

Optimized, the process component is the one contacting with the reaction gases in the MOCVD reaction chamber, including the gas showerhead component, the side wall of the reaction chamber and the lifting ring.

Optimized, the gas showerhead component includes the upper cover plate, gas distribution plate and water cooling plate. Said gas distribution plate has multiple groups of gas delivery pipes thereon. Said gas distribution plate, upper cover plate and water cooling plate are assembled into the gas showerhead component after being coated with protection films respectively.

Optimized, the protection film has the compact organization with the porosity of zero.

Optimized, the compositions of said protection film is one or more of the gallium nitride, aluminum nitride, magnesium nitride, gallium oxide, aluminum oxide, and magnesium oxide.

Optimized, the process component further includes an intermediate protection film between the stainless steel body and the protection film, and the porosity of the intermediate protection film is higher than that of the protection film.

Optimized, the porosity of the intermediate protection film is 1% to 5%.

Furthermore, the invention has also provided a method to improve the MOCVD reaction process, including the following steps:

provide a plasma protection film coating device including a vacuum chamber; a process component to be coated is fixed in said vacuum chamber. Said process component includes a stainless steel body that will contact with the reaction gases in the MOCVD reaction chamber;

said process component will be coated in the plasma protection film coating device with a compact protection film with the porosity of less than 1%. Said protection film is a compound composed of at least one of the Al, Ga and Mg and at least one of the oxygen or nitrogen, or the other materials that will not react with the gases in the MOCVD process;

the coated process component will be installed in the MOCVD reaction chamber for the MOCVD process, said protection film of the process component will protect the stainless steel body from reacting with the reaction gases in the MOCVD reaction chamber.

Optimized, the steps of coating the protection film on the process component in the plasma protection film coating device are as follows:

put the solid source material in said vacuum chamber;

put said process component to be coated in said vacuum chamber, and make the surface of the process component face to the source material in the vacuum chamber;

evaporate or sputter the source material on the surface of the process component to be coated;

inject the reaction gases and non-reaction gases in said vacuum chamber;

ionize said reaction gases and non-reaction gases and maintain the plasmas on the surface of the process component to be coated to make the ions of the ionized reaction and non-reaction gases hit on the surface of the process component to be coated and react with said source material so as to form compact protection film on at least a part of the surface of the gas showerhead component. Wherein, said protection film includes the atoms from the source materials and the atoms from the compositions of said reaction gas.

Optimized, the source material includes one or more of the solid aluminum, gallium, magnesium, gallium nitride, aluminum nitride, magnesium nitride, gallium oxide, magnesium oxide or aluminum oxide.

Optimized, the device used to ionize said reaction and non-reaction gases into plasmas is the plasma generator.

Optimized, the method to ionize said reaction and non-reaction gases into plasmas is microwave or radio frequency.

Optimized, said process component to be coated includes the gas showerhead component, side walls of the reaction chamber and the lifting ring.

Optimized, said process component to be coated is gas showerhead component; the gas showerhead component includes a gas distribution plate, an upper cover plate and a water cooling plate. The gas distribution plate, upper cover plate and water cooling plate shall be placed respectively in the plasma protection film coating device for coating the protection film before assembling into gas showerhead component.

Optimized, the plasma protection film coating device could coat the protection film with the thickness of 1 nm to 0.5 mm on the surface of the process component.

In the present invention, before installing said process component into the MOCVD reaction chamber, a compact protection film shall be coated on the surface of the stainless steel body, and the protection film is composed of the elements of the gases required during the MOCVD deposition process, or the other materials that will not react with the gases during the MOCVD process to ensure that the protection film will not react with the gases in the MOCVD process or add contaminants to the MOCVD reaction chamber. The above technology could ensure that, during the MOCVD production process, the $CP_2Mg$ gas introduced into the reaction chamber could not contact with the stainless steel surface, effectively preventing the reaction between the MOCVD reaction gases and the free iron ions on the stainless steel surface to avoid the possibility that, during the initial stage of the production, the iron ions of the stainless steel surface will reach the substrate at the bottom with the reaction gas to form deep levels in the gallium nitride LED structure. Meanwhile, the wastes of the $CP_2Mg$ gas that shall be constantly introduced into the MOCVD reaction chamber and the reduction of the equipment productivity could be avoided.

DESCRIPTION OF FIGURES

According to the following figures that have described the unlimited implementation in details, the other features, purposes and advantages of the invention will be more obvious.

DETAILED IMPLEMENTATION METHOD

Figure 1:
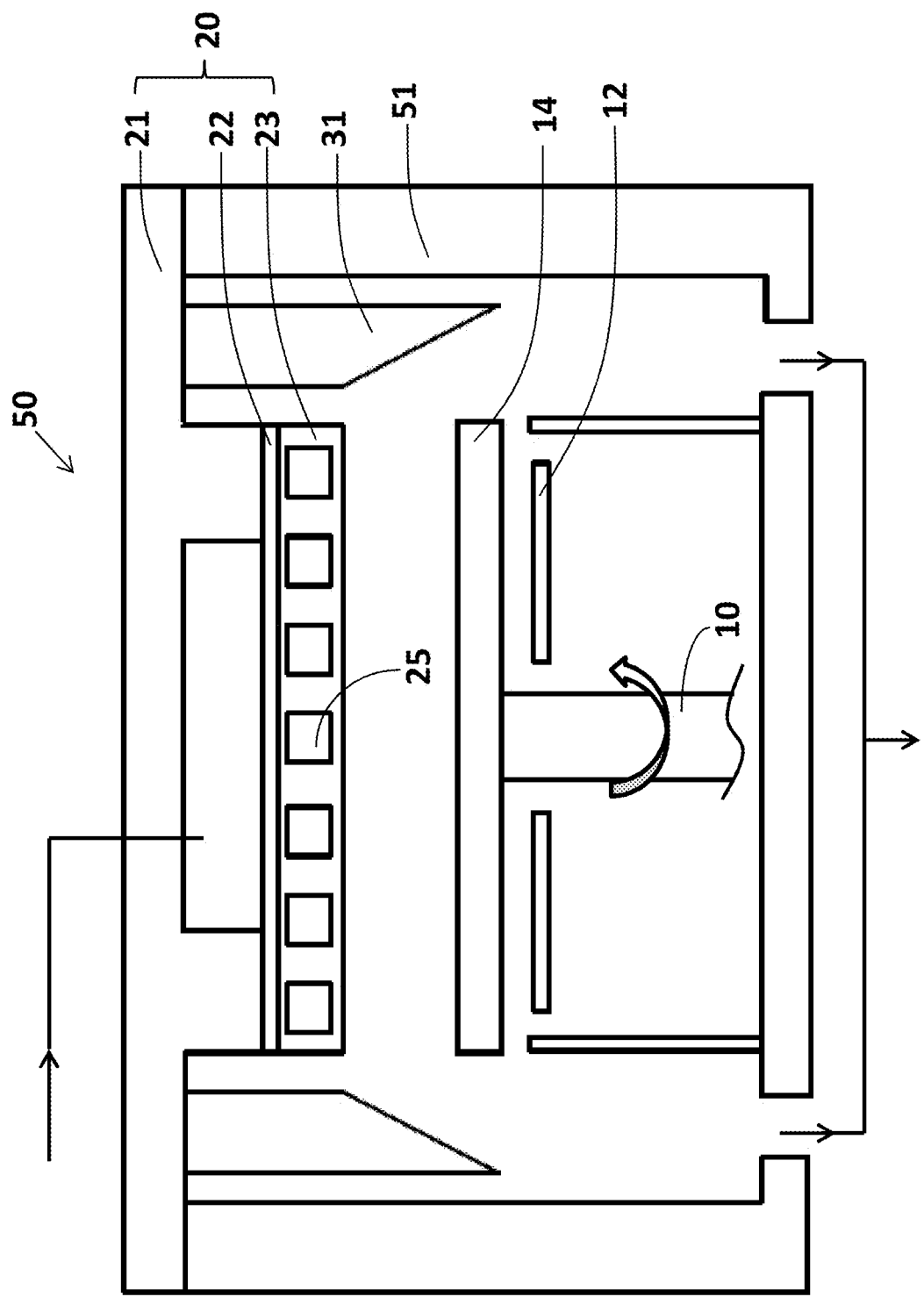
FIG. 1 shows the structure of the MOCVD reactor.

FIG. 1 shows the structure of the MOCVD reactor. As shown in FIG. 1, the Metal-organic Chemical Vapor Deposition (MOCVD) reactor includes a reaction chamber 50 made with the reaction chamber walls 51. There is a susceptor 14 in the reaction chamber 50. Several substrates for epitaxial growth are set on the susceptor 14, there is a rotation axis 10 under the center of the susceptor 14, which will rotate at a high speed with the susceptor 14 during the reaction. There is a heater 12 under the susceptor 14 to heat the susceptor 14 to the appropriate high temperature which is about 1000° C. to adapt the crystallization and growth of the GaN material. In the reaction chamber 50, the gas showerhead component 20 is disposed opposite the susceptor 14. The gas showerhead component 20 consists of the upper cover plate 21, gas distribution plate 22 and water cooling plate 23. The gas distribution plate 22 is used to distribute different reaction gases through gas delivery pipes (not shown in the figure) into the reaction chamber for deposition process reaction. The cooling plate 23 contains several cooling liquid pipes 25 used to cool down the high-temperature of the susceptor to prevent the abnormal high-temperature and deformation of the gas showerhead components and ensure the consistency of the reaction gases in the gas showerhead components. A lifting ring 31 is set on the inner side wall of the reaction chamber used to provide a symmetrical reaction chamber environment. Since the MOCVD generation of the gallium nitride requires high temperature of more than 1000° C., the whole reaction chamber walls 51, lifting ring 31 and gas showerhead component 20 are generally made of stainless steel. Since the MOCVD reaction process requires $CP_2Mg$ gas which may easily react with the free iron ions on the surface of stainless steel, and make the iron ions follow the reaction gas to the substrate at the bottom and form deep levels in the gallium nitride LED structure, which will finally influence the luminescence performance of the LED elements generated with MOCVD equipment. Therefore, this condition shall be prevented.

The invention disclosures a process component and method to improve the MOCVD reaction process. The improvement principle is to cover a compact protection film on the surface of the stainless steel body in the MOCVD reaction chamber. The process components are the stainless steel components that will contact with the reaction gases during the deposition process, such as the side walls of the reaction chamber, the gas showerhead component and the lifting ring surrounded the susceptor. Said process components include one stainless steel body. Before installing said process components into the MOCVD reaction chamber, a compact protection film shall be coated on the surface of the stainless steel body to ensure that, after installing said process components into the MOCVD reaction chamber and during the MOCVD deposition of the gallium nitride LED, the protection film could protect the stainless steel body from reacting with the $CP_2Mg$ gas, so as to reduce the initialization time of the MOCVD production process and improve the efficiency of the MOCVD equipment. Since the MOCVD production process also involves other reaction gases, the protection film could be made with the materials that will not react with the reaction gases, such as Teflon, or choose the elements of the reaction gas to form the protection film, such as one or more compounds composed of at least one of aluminum, gallium and magnesium and at least one of oxygen or nitrogen, so as to ensure that the protection film will not produce new contaminations during the deposition process.

Figure 2:
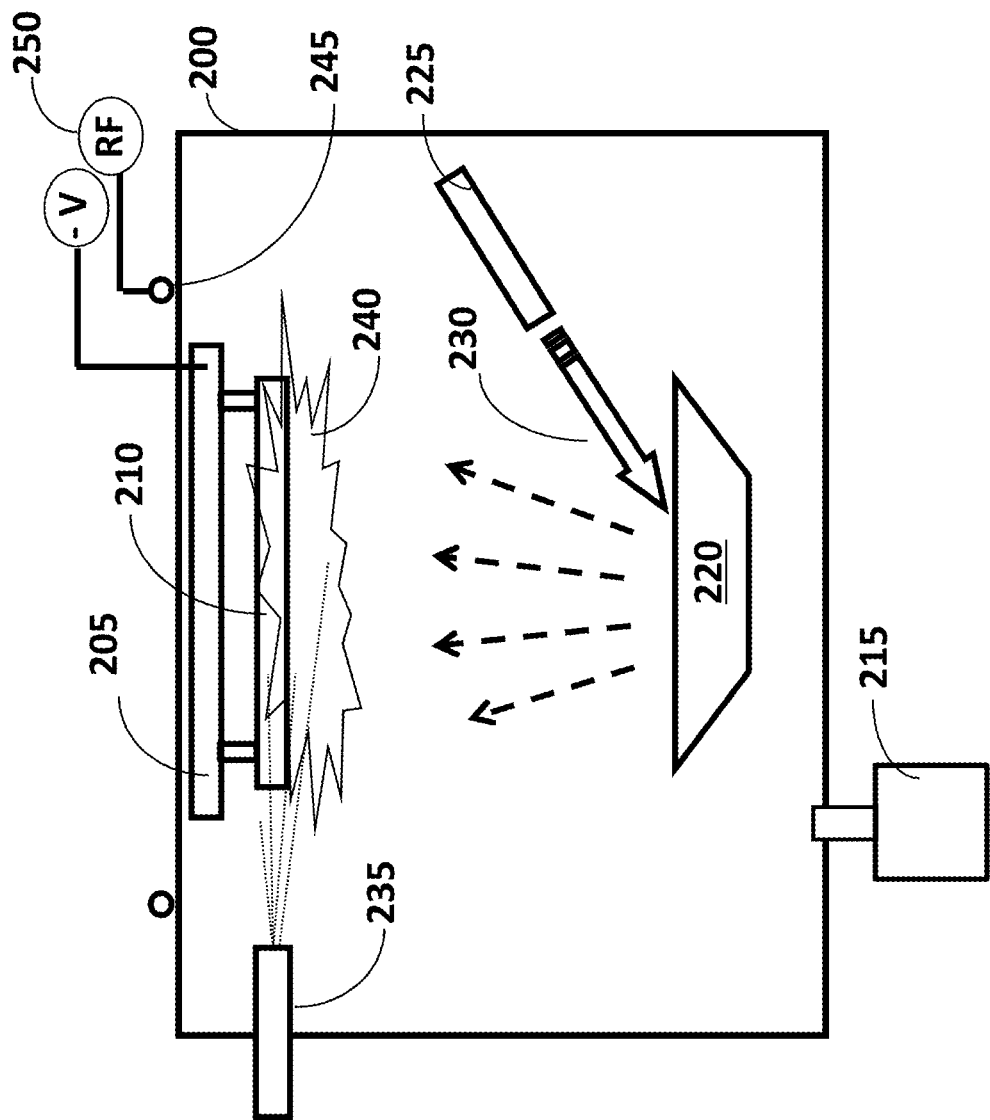
FIG. 2 shows a specific implementation for the plasma protection film coating device of the invention.

FIG. 2 shows a plasma protection film coating device, including a vacuum chamber 200, which will be vacuumed by the vacuuming system 215. The example component that is placed in the vacuum chamber for coating the protection film is the gas showerhead component, but also could be any other component. According to the structure of the gas showerhead component of the MOCVD reaction chamber shown in FIG. 1, the gas showerhead component to be coated consists of the upper cover plate 21, gas distribution plate 22 and water cooling plate 23, and the diameter of the gas delivery pipe of the gas showerhead component is relatively small. Therefore, to uniformly and fully coat the protection film on the surfaces of the stainless steel body that may contact with the reaction gases, before putting the gas showerhead component into the vacuum chamber 200, the gas showerhead component will be disassembled to coat the protection films on the surfaces that may contact with the reaction gases during the MOCVD process, and then the coated components will be set into the MOCVD reaction chamber after assembled together to provide reaction gases for the deposition process of the gallium nitride LED. The assembled components in the vacuum chamber 200 are marked as the main component 210 to be coated. The main component 210 is connected to the supporting ring 205 at certain distance. Meanwhile, the negative bias voltage is applied on the main component 210 through the supporting ring 205.

The source material 220 is placed at the bottom of the vacuum chamber 200. The source material contains the components to be deposited, which are normally in solid. For example, if the protection film to be deposited is one or more of gallium nitride, aluminum nitride, magnesium nitride, gallium oxide, aluminum oxide or magnesium oxide, the source material 220 shall contain the one or more of solid aluminum, gallium, magnesium, gallium nitride, aluminum nitride, magnesium nitride, gallium oxide, aluminum oxide or magnesium oxide. To form PVD, the source material shall be evaporated or spurted. In the embodiment shown in FIG. 2, the electron beam 230 generated by the electron gun 225 is used to evaporate the source material 220. The evaporated atoms and molecules will float to the main component 210 to be coated and condensate on the main component 210 (see the dotted arrow in the figure).

The plasma protection film coating device in FIG. 2 also includes a gas injector 235 which will be used to inject reaction or non-reaction gases into the vacuum chamber 200, such as oxygen, nitrogen, $CP_2Mg$ or argon. The reaction or non-reaction gases are ionized into plasma 240 through plasma source such as radio frequency or microwave. In the embodiment, the coil 245 coupled to the RF source 250 is selected as the plasma generator. The plasmas 240 are maintained around the main component 210 through the plasma source to coat the protection film on the main component 210. Meanwhile, in the embodiment, the negative bias voltage will be applied on the gas showerhead component through the supporting ring in the form of alternating voltage or pulse voltage, so as to attract the ions from the plasma 240 to bombard the surfaces of the main components to be coated such as the showerhead, to improve the binding force between the film and the base metal and the compact of the coat organization. Therefore, in the embodiment, the steps of coating compact protection films on the surfaces of the MOCVD components are as follows: at first, the gas injector 235 is used to inject reaction and non-reaction gases into the vacuum chamber 200, which will be ionized into plasma. The ions in the plasma, such as argon ions, will float to and bombard on the surfaces of the components to be coated under the negative bias voltage. At the same time, the source materials 220 will be evaporated by the electron beam 230, the evaporated atoms, radical and molecules will float to and deposit on the component to be coated. On the surfaces of the components to be coated, the deposition atoms (such as magnesium, aluminum and gallium as well as atoms of reaction gases, such as oxygen and nitrogen) and bombing ions (such as argon ions) will exchange to form compact film with strong binding force. The process of coating involves the interaction of the PVD of plasma and the material, and the forming of the film could be improved due to the bombing of the ions.

The features of the embodiment are: since there is certain distance between the gas showerhead component and the supporting ring 205, the upper and lower surfaces of the main body 210 to be coated will be immersed in the plasma, and the upper and lower surface of the main body 210 will be coated at the same time. The film forming velocity could be adjusted or increased by the heating efficiency of the electron gun. The binding force between the film and the base metal and the organization and performance of the film could be improved by adjusting the plasma density, chemical composition, the bias voltage and the ion bombardment energy. In addition, the temperature of the surface of the main body to be coated could be controlled by adjusting the distance between the source material and the main body to be coated and the heating power.

In the embodiment, there are many groups of gas delivery pipes with small diameter on the gas distribution plate 22. In the traditional protection film coating process, the internal surfaces of gas delivery pipes can hardly be covered by the protection film uniformly. In the embodiment, the gas distribution plate is placed in the plasma protection film coating device shown in FIG. 2. The lower surface of the above component is covered by a protection film According to the above description, the plasma protection film coating device is using atoms and molecules to form protection film, and the internal surfaces of the gas delivery pipes are also covered by the protection film. Furthermore, different from the protection film made with the prior technologies, the protection film in the embodiment is formed by condensation of atoms and molecules, and the compact and uniform protection film with good adhesion will be form on the internal walls of the gas delivery pipes, providing smooth gas flows and preventing particle contamination.

According to the above embodiment, to improve the thickness of the compact protection film and reduce the binding stress between the protection film and the stainless steel base and improve the organization stability of MOCVD components, the components to be coated such as the showerhead component, the side walls of the reaction chamber and the lifting ring could have certain surface roughness such as 0.01 μm to 10 μm. According to the embodiment, when the thickness of the surface compact protection film is 1 nm to 10 μm, the surface roughness of the stainless steel body is 1μm to 2 μm. When the thickness of the surface compact protection film is 10 μm to 0.5 mm, the surface roughness of the stainless steel body is 2 μm to 10 μm. In the invention we have found that, the deposition of the protection film within certain surface roughness scope with ion bombardment could effectively improve the binding force between the coated compact protection film and the stainless steel base, improve the organization stability of the compact protection film and minimize the particle contamination during the MOCVD production. According to a detailed embodiment, the roughness could be obtained during the deposition of the protection film, or by polishing the deposited protection film, or through grinding or other PEPVD surface treatment.

Figure 3:
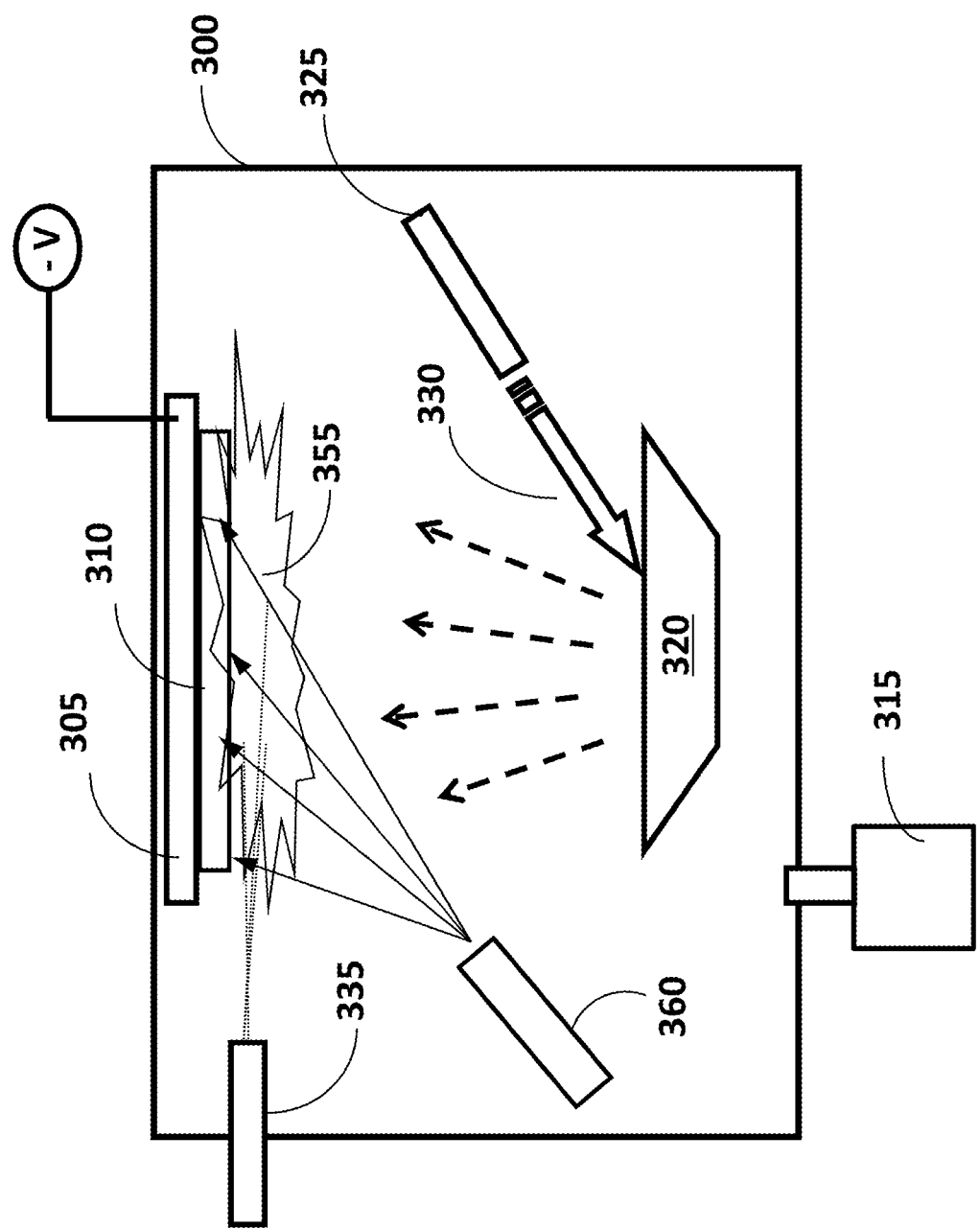
FIG. 3 shows another a specific implementation for the plasma protection film coating device of the invention.

FIG. 3 shows another plasma protection film coating device, including a vacuum chamber 300, which will be vacuumed by the vacuuming system 315. The electron beam 330 generated by the electron gun 325 is used to evaporate the source material 320. The evaporated atoms and molecules will float to the main body 310 to be coated and condensate on the main body 310 (see the dotted arrow in the figure). The difference between the embodiment shown in FIG. 3 and that in FIG. 2 is that there is a ion generator or ion source 360. The ion source could ionize the gases injected into it such as argon into plasma and transfer the ions in plasma into energy ion beam 355. During the process of the protection film deposition, the energy-ion beam 355 could bombard the main body 310 to be coated with certain ion energy. During this process, the evaporated or sputtered source material 320 will flow to the surface of the main body 310 at a higher speed, to form a compact protection film on the surface of the main component under the bombardment of the energy-ion beams In addition, energy-ion beam 355 could ionize the oxygen or nitrogen and $CP_2Mg$ injected through the gas injector 335, and take the ionized organic components to participate in the coating process of the protection film In the embodiment, since the ion beam could only bombard to the main body 310 from the ion generator, the main body 310 could attach to the supporting ring 305, and after coating the film on one side of the main body 310, the main body 310 shall be changed to another direction, to make the side former attaching to the supporting ring 305 face to the ion beam 355 for protection film coating.

With the plasma protection film coating devices shown in FIG. 2 and FIG. 3, before the deposition of the protection film, the energy ions could bombard or hit the surface of the main body 310 to be coated, which could effectively remove the contaminants attached on the surface, so as to improve the binding force between the deposited protection film and the clean surface. By adjusting the roughness of the main body 310 and using the plasma protection film coating device to deposite reinforced protection film shown in FIG. 2 and FIG. 3, the thickness of the protection film deposited on the surface of the main body 310 is 1 nm to 0.5 mm.

Figure 4A:
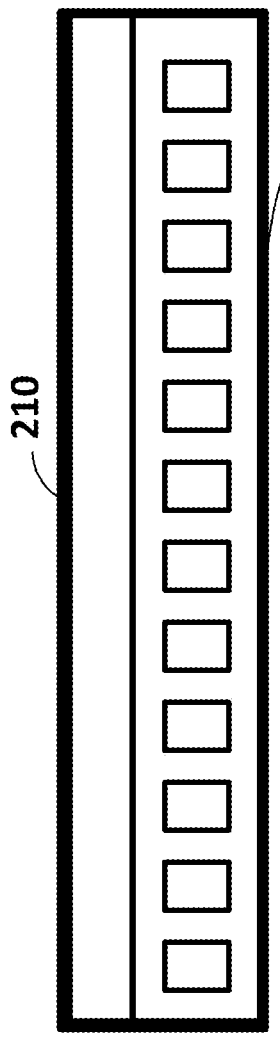
FIG. 4a shows the process component with protection film prepared by the invention.
Figure 4C:
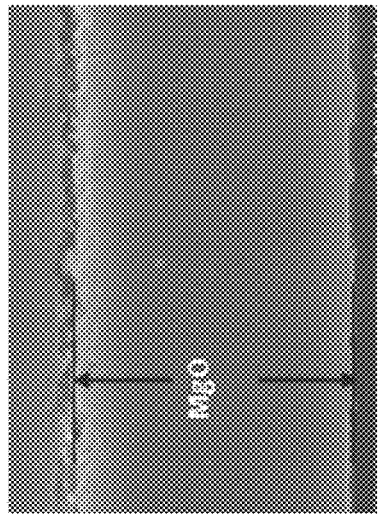
FIG. 4c shows the appearance of section organization of the magnesium oxide film coated on the stainless steel surface.
Figure 4B:
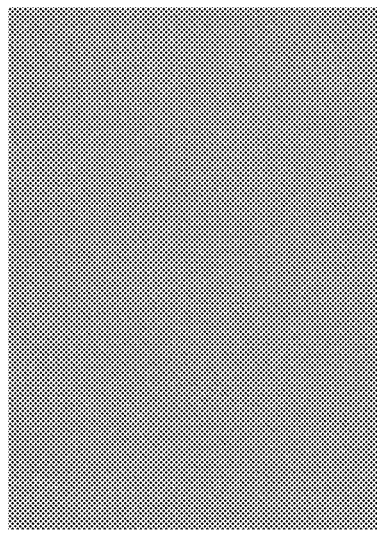
FIG. 4b shows the appearance of the magnesium oxide film coated on the stainless steel surface.

FIG. 4a shows a process component covered by the protection film 255. The compact protection film 255 is deposited on the surface of the process component 210 or 310 through the plasma protection film coating device shown in FIG. 2 and FIG. 3. FIG. 4a shows the surface of the process component 210 after the protection film is deposited. During the deposition of the protection film, the surface temperature of the MOCVD chamber components could be increased to 750° C. However, to avoid the deformation of the components caused by high temperature, the temperature of the surface of the main body will be controlled under 200° C. To improve the compact of the film and the binding force with the base metal, and prevent the ion bombardment sputtering effect, the energy of ion bombardment is in the range of 20-5000 eV. To ensure the sufficient film coating velocity, the power of the heating source of the electron gun is 0.05 kW-20 kW. The process gases include argon and oxygen with the flow of Osccm-2000 sccm. FIG. 4b shows the appearance of the magnesium oxide film deposited on the stainless steel surface. In the view of the 100,000 times amplification, the magnesium oxide coat is composed of slight and compact grains. FIG. 4c shows the appearance of the section structure of the magnesium oxide film on the stainless steel surface. In the view of 20,000 times amplification, the magnesium oxide section is compacted without any cracks or holes, and the porosity of the compact protection film (the proportion of holes and cracks to the volume of the film) is zero. According to FIGS. 4b and 4c, no organize or coat flaw could be found in the microscope organization and appearance, indicating that the plasma protection film coating device and the coating processes used in the invention could ensure the excellent organization stability of the compact protection film deposited on the surfaces of the MOCVD chamber components and improve the process performances of the MOCVD chamber components.

Given the difference between the coefficients of thermal expansions of the stainless steel and the protection film, there will be relative displacement in case of frequent temperature changes, which may lead to the falling off of the protection film. To avoid such condition, a first layer of protection film (the porosity of 1%-5%) with cracks could be formed on the stainless steel surface, and then the second layer of the protection film (porosity of less than 1%) without gaps could be formed on the first layer of protection film During the forming of the first film, the power of the electron gun 255 could be increased according to the embodiment specified in FIG. 2 to evaporate more protection film material to the stainless steel surface. In case of higher forming speed, the upper layer material will rapidly cover the areas without sufficient coverage of the first layer, leading to cavities or cracks.

The compact protection film prepared in the invention could fully cover the surfaces of the stainless steel body in the MOCVD reaction chamber, effectively preventing the reaction between the MOCVD reaction gases and the free iron ions on the stainless steel surface, and eliminating the possibility that the iron ions may follow the reaction gas to the bottom substrate and form deep levels in the gallium nitride LED structure which is existed in the initial stage of the prior MOCVD process. Therefore, if the stainless steel components with compact protection films could be installed in the MOCVD equipment and the reaction chamber, such as the gas showerhead component, reaction chamber side walls and lifting rings, the luminescence performance of the LED formed during the initial MOCVD production process could be ensured, the qualification rate of the LED epitaxial wafers made through MOCVD could be improved, the long-time required in the current industrial production to treat the stainless steel surfaces with CP2Mg could be avoided, and the quality of the MOCVD process and the productivity of the MOCVD equipment could be significantly improved.

Although the invention is published as above in a good implementation method, it is not intended to limit the invention. Any skilled people in the art may make changes and modifications to the invention within the scope of the invention. Therefore, the protection scope of the invention shall be in accordance with the scope defined in the claims of the invention.

What is claimed is:

1. A method for fabricating a showerhead for MOCVD chamber, comprising the steps:
   fabricating an upper cover plate out of stainless steel;
   fabricating a gas distribution plate out of stainless steel;
   fabricating a water cooling plate out of stainless steel;
   coating the cover plate, gas distribution plate and water cooling plate with a protective film;

assembling the cover plate, gas distribution plate and water cooling plate into the showerhead after the step of coating; and, wherein the step of coating comprises the sub-steps of:
placing at least one of the cover plate, gas distribution plate and water cooling plate inside a vacuum chamber;
placing a solid source material inside the vacuum chamber;
applying negative bias voltage to the at least one of the cover plate, gas distribution plate and water cooling plate;
directing an electron beam from an electron gun onto the solid source material to thereby evaporate the source material.

2. The method of claim 1, wherein the step of coating comprises forming a layer of a compound of at least one of Al, Ga and Mg, and at least one of nitrogen and oxygen, over surfaces of the cover plate, gas distribution plate and water cooling plate.

3. The method of claim 2, wherein the protective film is made to a thickness of 1 nm to 10 μm.

4. The method of claim 3, wherein fabricating the cover plate, gas distribution plate and water cooling plate comprises forming surfaces of the stainless steel to roughness of 1 μm to 2 μm.

5. The method of claim 1, further comprising forming an intermediate coating prior to the step of coating with a protective film.

6. The method of claim 5, wherein forming an intermediate coating comprises forming a coating having a porosity of 1% to 5%, and wherein coating a protective film comprises forming a protective film having a porosity of less than 1%.

7. The method of claim 5, wherein forming the intermediate coating comprises the steps of:
placing at least one of the cover plate, gas distribution plate and water cooling plate inside a vacuum chamber;
placing a solid source material inside the vacuum chamber;
applying negative bias voltage to the at least one of the cover plate, gas distribution plate and water cooling plate;
applying power to an electron gun to generate an electron beam and directing the electron beam onto the solid source material to thereby evaporate the source material to thereby form an intermediate coating of a first porosity;
and wherein the step of coating comprises reducing the power to the electron gun, to thereby form a protective coating of second porosity lower than the first porosity.

8. The method of claim 1, further comprising injecting gas selected from oxygen, nitrogen, $CP_2Mg$ or argon into the vacuum chamber.

9. The method of claim 8, further comprising ionizing the gas into plasma.

10. The method of claim 9, wherein applying negative bias voltage comprises applying alternating voltage or pulsed voltage.

11. The method of claim 9, further comprising immersing the at least one of the cover plate, gas distribution plate and water cooling plate in the plasma.

12. The method of claim 9, further comprising energizing an ion generator to bombard the at least one of the cover plate, gas distribution plate and water cooling plate with an ion beam.

13. The method of claim 12, wherein energy of ion bombardment is in the range of 20-5000 eV.

14. The method of claim 1, wherein the solid source material comprises one of magnesium, aluminum and gallium.

15. The method of claim 1, wherein power applied to the electron gun is 0.05 kW-20 kW.

16. The method of claim 1, further comprising maintaining the temperature of the at least one of the cover plate, gas distribution plate and water cooling plate to remain under 200° C.

17. The method of claim 1, further comprising:
installing the showerhead into an MOCVD chamber after the step of coating;
heating a susceptor of the MOCVD chamber to more than 1000° C. injecting $CP_2Mg$ gas into the MOCVD chamber.

18. The method of claim 1, wherein the step of coating comprises coating with magnesium oxide film.

* * * * *